United States Patent
Chandrasekharan et al.

(10) Patent No.: US 8,723,548 B2
(45) Date of Patent: May 13, 2014

(54) HYSTERESIS-BASED LATCH DESIGN FOR IMPROVED SOFT ERROR RATE WITH LOW AREA/PERFORMANCE OVERHEAD

(75) Inventors: Karthik Chandrasekharan, Scottsdale, AZ (US); Balaji Narasimham, Santa Ana, CA (US); Gregory Djaja, Phoenix, AZ (US)

(73) Assignee: Broadcom Corporation, Irvine, CA (US)

( * ) Notice: Subject to any disclaimer, the term of this patent is extended or adjusted under 35 U.S.C. 154(b) by 76 days.

(21) Appl. No.: 13/478,760

(22) Filed: May 23, 2012

(65) Prior Publication Data
US 2013/0234753 A1   Sep. 12, 2013

Related U.S. Application Data

(60) Provisional application No. 61/607,266, filed on Mar. 6, 2012.

(51) Int. Cl.
*H03K 19/003* (2006.01)
(52) U.S. Cl.
USPC .................................. 326/9; 326/93; 327/202
(58) Field of Classification Search
USPC ............................................................ 326/9
See application file for complete search history.

(56) References Cited

U.S. PATENT DOCUMENTS

| | | | |
|---|---|---|---|
| 6,492,854 B1 * | 12/2002 | Ku et al. | 327/202 |
| 6,629,236 B1 * | 9/2003 | Aipperspach et al. | 712/228 |
| 8,085,076 B2 * | 12/2011 | Djaja et al. | 327/202 |
| 8,427,214 B2 * | 4/2013 | Pal | 327/202 |
| 2002/0000858 A1 * | 1/2002 | Lu | 327/202 |

OTHER PUBLICATIONS

Calin et al., "Upset Hardened Memory Design for Submicron CMOS Technology," IEEE Transactions on Nuclear Science, vol. 43, No. 6, Dec. 1996.
Lee et al., "Design Framework for Soft-Error-Resilient Sequential Cells," IEEE Transactions on Nuclear Science, vol. 58, No. 6, Dec. 2011.
Jagannathan et al., "Single-Event Tolerant Flip-Flop Design in 40-nm Bulk CMOS Technology," IEEE Transactions on Nuclear Science, vol. 58, No. 6, Dec. 2011.
Seifert et al., "On the Radiation-Induced Soft Error Performance of Hardened Sequential Elements in Advanced Bulk CMOS Technologies," 2010.
Robert C. Baumann, "Radiation-Induced Soft Errors in Advanced Semiconductor Technologies," IEEE Transactions on Device and Materials Reliability, vol. 5, No. 3, Sep. 2005.

* cited by examiner

*Primary Examiner* — Alexander H Taningco
*Assistant Examiner* — Nelson Correa
(74) *Attorney, Agent, or Firm* — Duane S. Kobayashi

(57) ABSTRACT

A hysteresis-based logic element design for improved soft error rate with low area/performance overhead. In one embodiment, a hysteresis inverter block including one or more pairs of inverters can be coupled to a logic element to adjust a switching threshold of the logic element.

17 Claims, 6 Drawing Sheets

HYSTERESIS-BASED LATCH DESIGN FOR IMPROVED SOFT ERROR RATE WITH LOW AREA/PERFORMANCE OVERHEAD

This application claims priority to provisional patent application No. 61/607,266, filed Mar. 6, 2012, which is incorporated by reference herein, in its entirety, for all purposes.

BACKGROUND

1. Field of the Invention

The present invention relates generally to logic element design, and more particularly, to a hysteresis-based logic element design for improved soft error rate with low area/performance overhead.

2. Introduction

With technology scaling and the associated reduction in the critical charge of a cell, logic designs are getting more susceptible to single event upsets. Although arrayed memory cells can be protected with ECC or other error detection/correction schemes, protecting flip-flops against single event upsets can be difficult.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
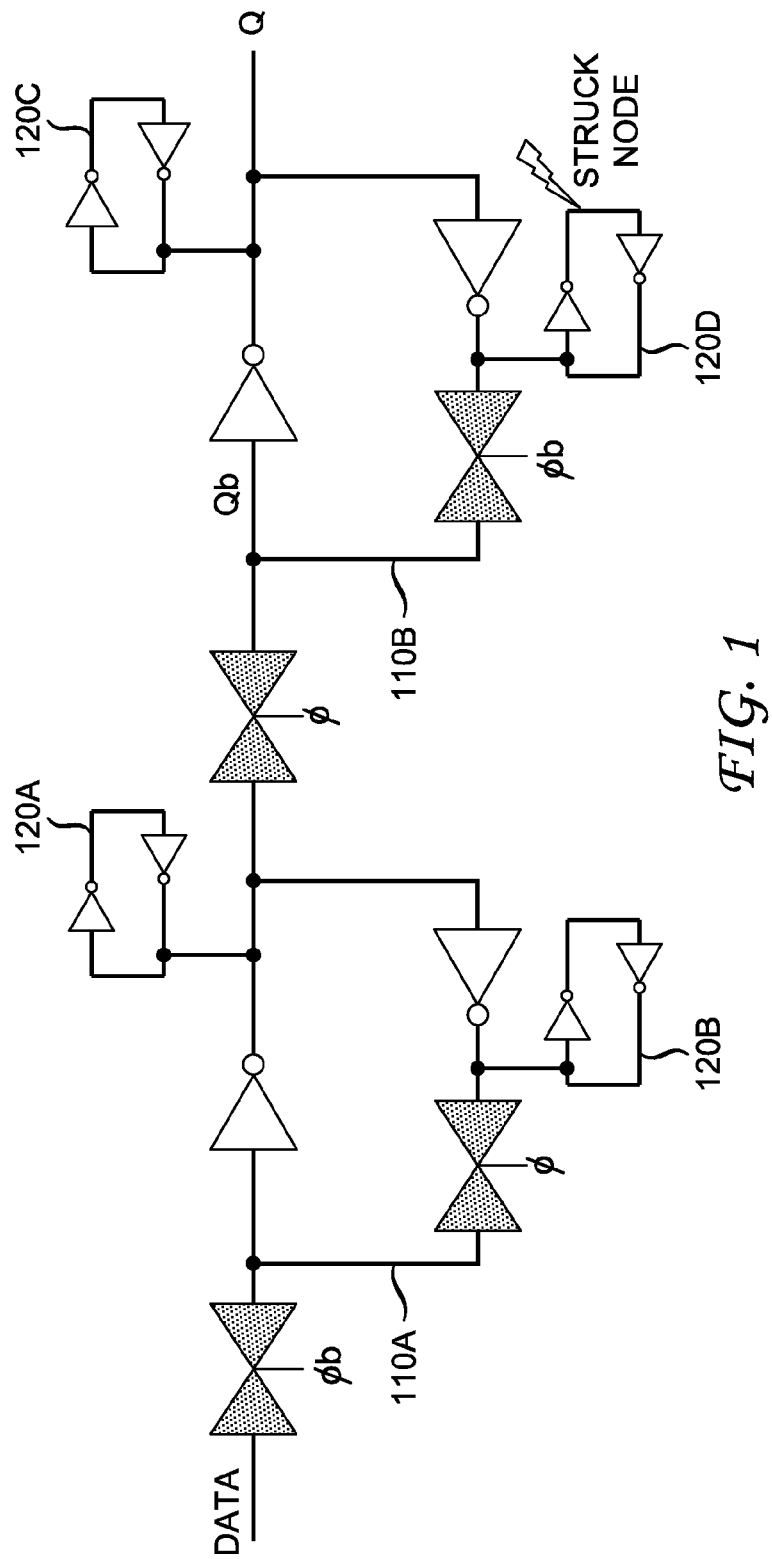
FIG. 1 illustrates an example of a transmission gate based D-flip-flop using hysteresis.
Figure 2:
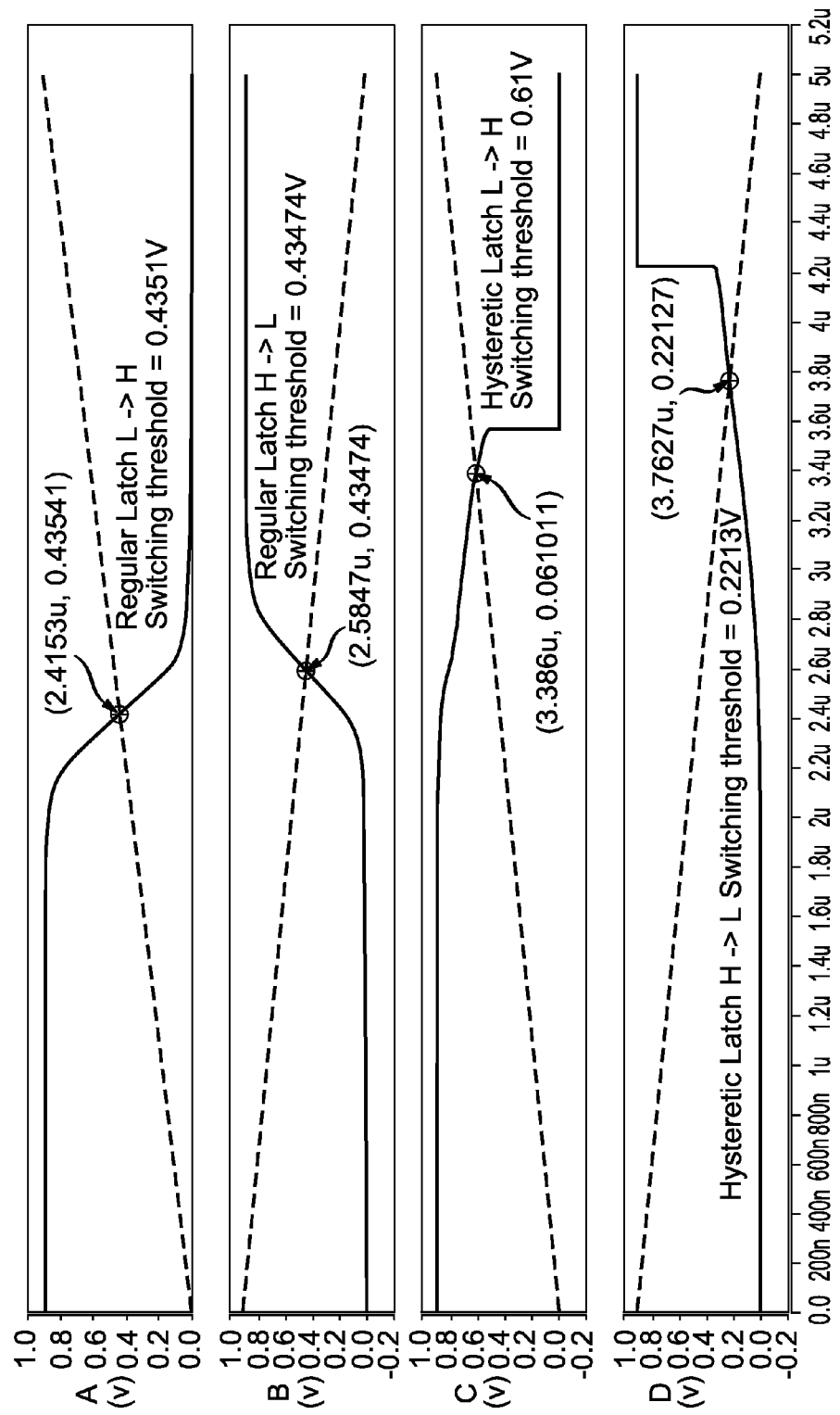
FIGS. 2A-2D illustrate a simulation that demonstrates an example impact of a hysteresis-based logic element design.

Various embodiments of the invention are discussed in detail below. While specific implementations are discussed, it should be understood that this is done for illustration purposes only. A person skilled in the relevant art will recognize that other components and configurations may be used without parting from the spirit and scope of the invention.

Certain embodiments of the invention can be found in a hysteresis-based logic element design for improved soft error rate (SER) with low area/performance overhead. A hardening technique based on hysteresis can be used to increase the switching threshold and, in turn, the critical charge, while minimizing the impact on the sensitive logic device area. This hysteresis-based logic element design results in much better SER performance along with a lower area overhead.

In general, soft errors can occur when a radiation event causes enough of a charge disturbance to reverse or flip the data state of a logic element such as a memory cell, register, latch, or flip-flop. Soft errors involve changes to data (e.g., the electrons in a storage circuit), but do not necessarily indicate changes to a physical circuit. For this reasons, error is labeled as a "soft" error as the logic element's physical circuit has not been permanently damaged by the radiation event.

After a soft error has been observed, there is no implication that a circuit or component is unreliable. In other words, if data is rewritten after a soft error, a circuit can still function properly and the error may go unnoticed.

Background radiation from alpha particles, neutrons and cosmic rays can create soft errors in an integrated circuit (IC). Momentary upsets or single-event upsets (SEUs) in data inside an IC can lead to a soft error. Some SEUs, called single-event transients (SETs), do not affect bit values. Other, more severe SEUs can affect the value of one or more bits. SEUs that affect the value of one bit are called single bit upsets (SBUs). The rate at which SBUs occur affects the IC's SER. The SER of an IC is therefore the rate at which soft errors occur due to, for example, background radiation.

SBUs may go unnoticed if the data is changed back to the correct value before it is stored. However, an SBU may cause a soft error if the upset data is stored or if the upset directly changes the data contained in a storage element. Modern technology is more susceptible to upsets due to reductions in feature sizes and operating voltages. With such reductions, the SER of standard logic elements in ICs continues to rise. Thus, reducing the SER associated with logic elements has become an important design consideration.

SER for ICs can be reduced at a system level or at an individual gate level. At the system level, products targeted for devices more likely to receive increased background radiation, such as satellites, have been designed to increase SER tolerance by using temporal or special displacement schemes, or by replicating logic and using voting schemes. Different designs have been used which trade off area, power performance and SER. System and architectural solutions to reduce SER require customer interaction which may not be practical and can be expensive in terms of the IC die area required. A voting scheme, for example, may require three times the die size of a traditional design that is not enhanced to address soft errors. Due to additional requirements, conventional solutions to reduce SER are almost exclusively used for space, medical or military markets, which can tolerate the high initial device cost to reduce the cost of a failing device.

The SER of a logic element depends on the critical charge and sensitive area of the logic element. Accordingly, for the same sensitive logic element area, a higher critical charge will help lower the SER. While there are many approaches to increasing the critical charge of the logic element, many of those approaches also result in increasing the sensitive area, thereby negating the overall impact on SER.

In the present invention, it is recognized that the critical charge is also directly related to the switching threshold (among other parameters, such as nodal capacitance, transistor drive currents, etc.) of individual gates. Higher switching threshold can necessitate higher voltage swings, thereby resulting in an increased critical charge.

As described below, a hysteresis-based logic element design can be used to improve SER without incurring significant low area/performance overhead costs. An example of a hysteresis-based logic element design is illustrated in FIG. 1, which provides an example of a transmission gate based D-flip-flop (DFF). As illustrated, the example transmission gate based DFF is built by combining two serial latches 110A, 110B in a master-slave configuration. Each serial latch 110A, 110B is based on a pair of back-to-back inverters. Serial latch 110A represents the master circuit, while serial latch 110B represents the slave circuit. The two serial latches 110A, 110B in series with the appropriate clock connection are used to form an edge-triggered DFF.

In operation, the transmission gate based DFF receives an input signal on Data, and provides an output signal on Q. The inverters in the serial latches 110A, 110B would receive a supply voltage VDD (not shown). In the illustrated embodiment, the serial latches 110A, 110B also include transmission gates that are controlled by opposite clock signals PHIb and PHI. In various embodiments, the transmission gates can be implemented with a pair of NMOS and PMOS transistors, or can be implemented with a single transistor, as is known in the art.

In operation, the transmission gate based DFF is turned on when the supply voltage VDD is provided. While the transmission gate based DFF is turned on, the master and slave circuits can store data. Specifically, while the transmission gate based DFF is turned on and in active use, a logical value present on Data will be stored in the transmission gate based DFF and available on Q in synchronization with clock signals PHIb and PHI.

In accordance with the present invention, serial latches 110A, 110B are enhanced to provide immunity to soft errors. In the example illustrated embodiment, serial latches 110A, 110B are enhanced through the coupling of one or more secondary cross-coupled inverter pairs (or hysteresis inverters) with weaker drive.

Consider serial latch 110A as an example. As illustrated serial latch 110A is coupled to secondary cross-coupled inverter pairs forming hysteresis inverter blocks 120A, 120B. Similarly, serial latch 110B is coupled to secondary cross-coupled inverter pairs forming hysteresis inverter blocks 120C, 120D. The addition of a hysteresis inverter block to a latch serves to shift the switching threshold of one of the transitions (low-to-high or high-to-low). Accordingly, the addition of the two hysteresis inverter blocks 120A, 120B serves to shift the switching threshold of the transitions for both transitions. The effect of shifting the switching threshold is to increase the noise margin, which effectively increases the critical charge of the latch.

FIGS. 2A-2D illustrates a simulation that demonstrates an example impact of a hysteresis-based logic element design. This example impact is demonstrated for a 28 nm design with a supply voltage of 0.9V and shows the shifting of the switching threshold voltage from a latch without coupling to hysteresis inverters to a latch with coupling to hysteresis inverters.

Figure 3:
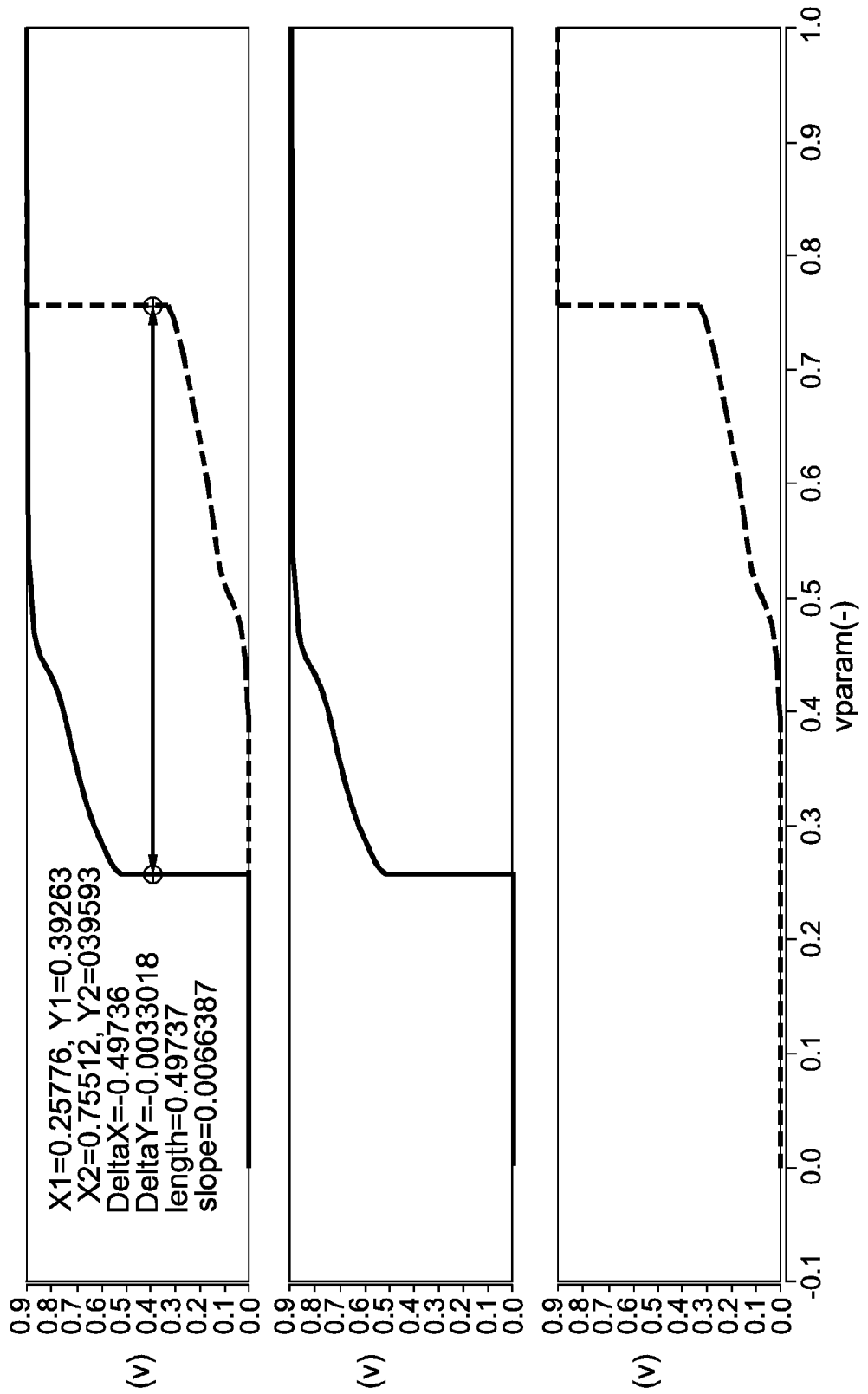
FIG. 3 illustrates a hysteresis loop.

As illustrated, the switching threshold voltage for a low-to-high transition has shifted from a switching threshold voltage of 435 mV (FIG. 2A) for a latch without coupling to hysteresis inverters to a switching threshold voltage of 610 mV (FIG. 2C) for a latch with coupling to hysteresis inverters. Similarly, the switching threshold voltage for a high-to-low transition has shifted from a switching threshold voltage of 434 mV (FIG. 2B) for a latch without coupling to hysteresis inverters to a switching threshold voltage of 221 mV (FIG. 2D) for a latch with coupling to hysteresis inverters. The adjustment of the switching threshold can also be represented by the hysteresis loop illustrated in FIG. 3.

As this simulation illustrates, the addition of the hysteresis inverters to the latch has changed the switching threshold by an amount between 175 mV to 187 mV. In the present invention, it is recognized that the increased switching threshold results in increasing the critical charge needed to upset the hysteresis cell.

Here, it should be noted that while the hysteresis inverters help improve the critical charge, they do not significantly affect the sensitive cell area of the latch. This results because the hysteresis inverter can be designed to have a weaker drive compared to the inverter in the main latch. In one embodiment, the hysteresis inverter can have a drive that is weaker a factor of 2 or more. As a result, an upset to the hysteresis latch does not force the main latch to change state. Rather, it merely causes a reduced logic high or low state in the main latch.

Figure 4:
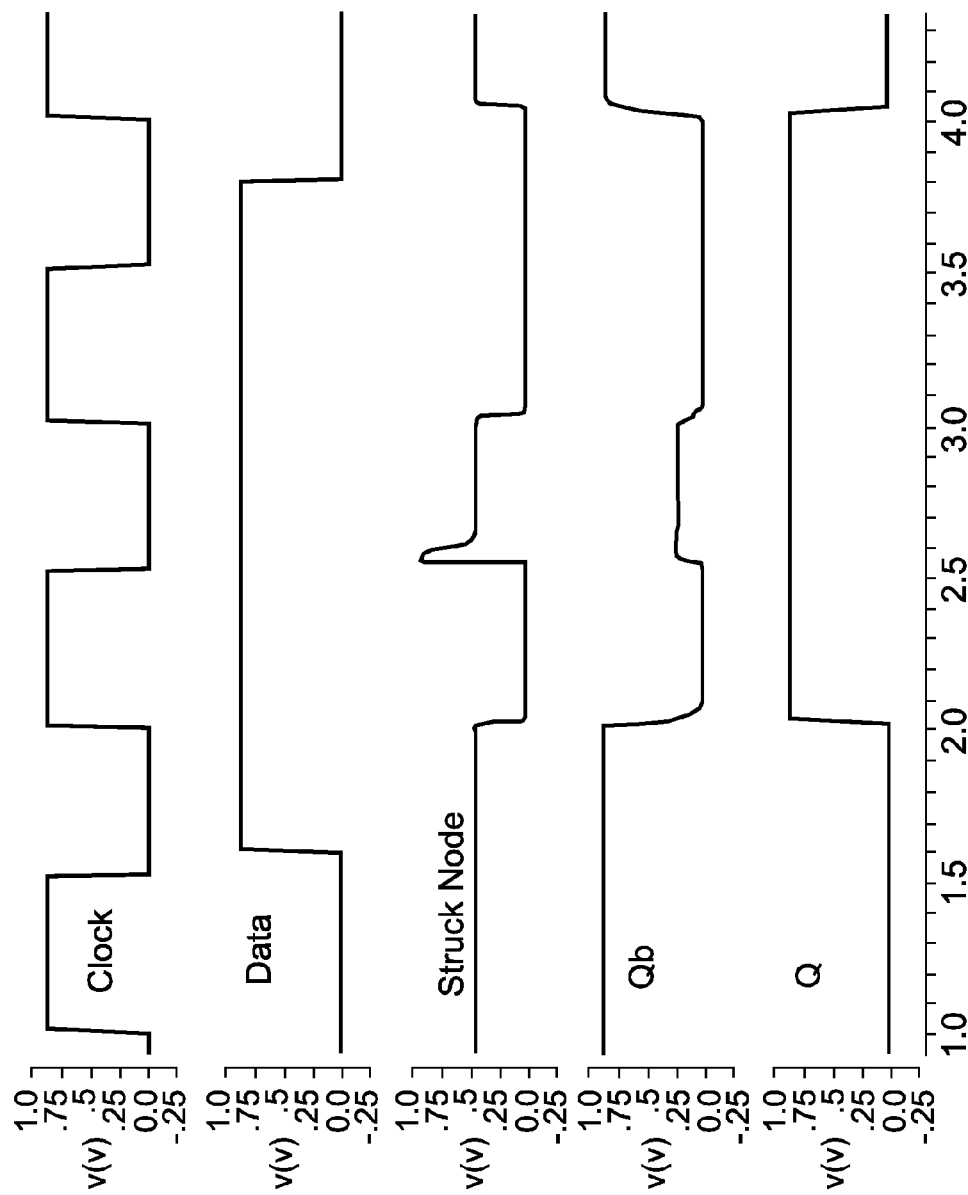
FIG. 4 illustrates an impact of a charge injection simulation.

To illustrate the hardening of the example transmission gate based DFF of FIG. 1, a double-exponential current pulse was used to inject charge at the hysteresis inverter node (indicated as 'Struck node') in FIG. 1. The example impact of a charge injection simulation is illustrated in FIG. 4, which shows the transient voltage waveforms of the Clock, Data, Struck Node, Qb, and Q nodes of the example transmission gate based DFF of FIG. 1, wherein the ion hit was at a time instant of 2.55 ns.

As demonstrated by the charge injection simulation, the Struck Node makes a complete swing, node Qb of the main latch transitions only marginally, and the Q node is not affected. This demonstrates that the increased area required by the hysteresis inverters does not increase the SER because it has not impact on the data stored in the latch. Thus, in terms of the sensitive area, the hardened design is comparable to a latch design without hysteresis inverters. For multimode charge collection, main storage nodes in the hardened design would behave in a manner similar to a design without hysteresis inverters. But any charge collected by hysteresis storage nodes alone (through single-node or multi-node collection) does not result in an upset. Moreover, by interleaving the hysteresis inverters between the inverters of the main latch, detrimental multi-node charge collection can be reduced, and state reinforcing type of multi-node charge collection can be enhanced. Results have indicated that the hardened design principles that are illustrated by example in FIG. 1 produces a critical charge that is more than three times greater than the critical charge for a design without coupling to hysteresis inverters.

Figure 5:
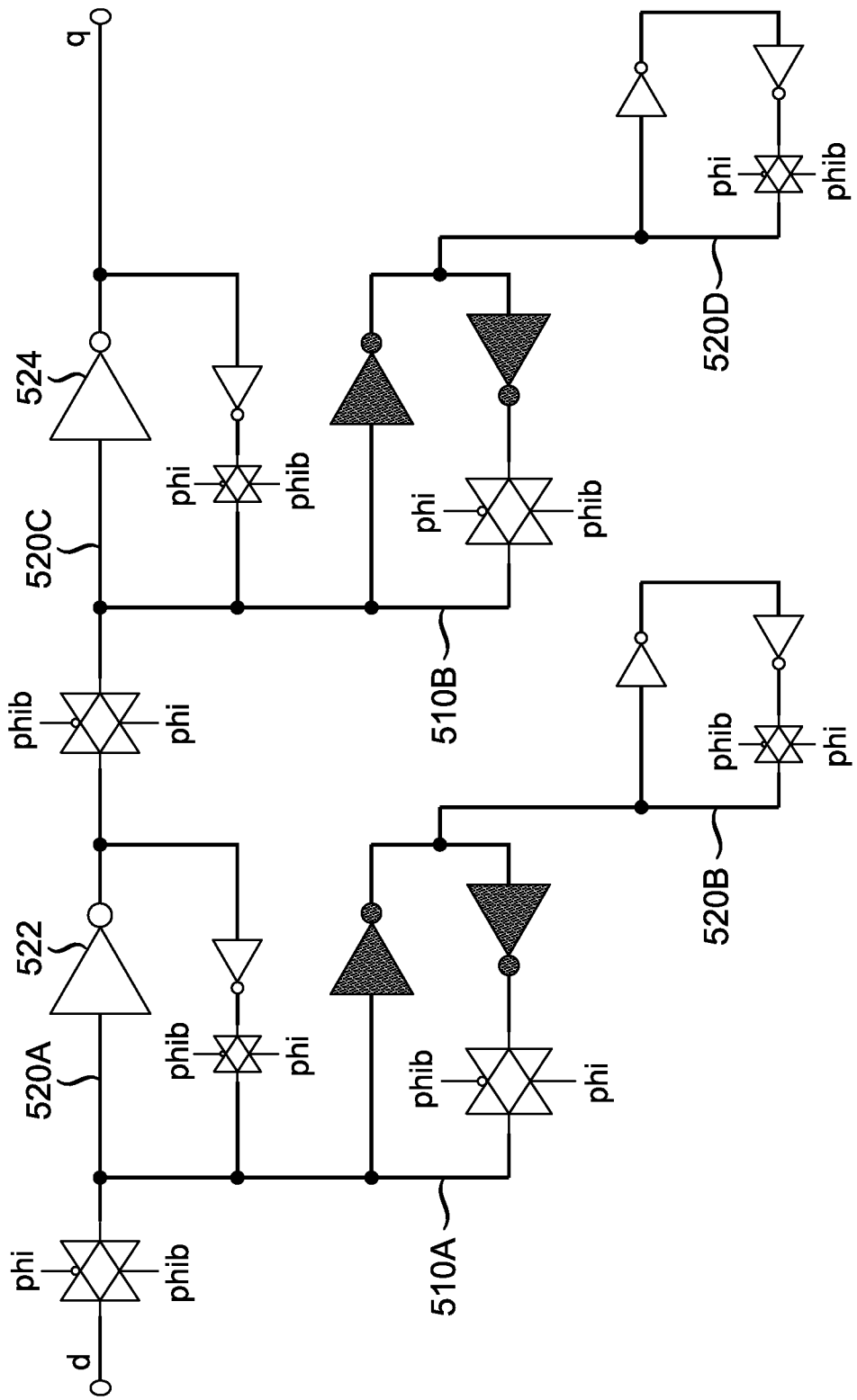
FIG. 5 illustrates an example of an implementation of a D-Flip-Flop using hysteresis.

FIG. 5 illustrates an example of an implementation of a DFF using the hysteresis concepts illustrated in FIG. 1. As illustrated, the hysteresis inverter blocks 520A, 520B are coupled to latch 510A, while hysteresis inverter blocks 520C, 520D are coupled to latch 510B. In this implementation, inverters 522 and 524 that are included in hysteresis inverter blocks 520A and 520C, respectively, are in the data path. Accordingly, inverters 522 and 524 have been sized for performance purposes.

As illustrated in this embodiment, the hysteresis inverter blocks can also be gated by the clock, which serves to reduce power and cell delay. In another embodiment, the hysteresis inverter blocks are not gated by the clock.

It should also be noted that a hysteresis inverter block need not be confined to a single pair of inverters. Rather, in other embodiments, the hysteresis inverter block can include multiple pairs of inverters. Here, it is recognized that the inclusion of multiple pairs of inverters in a hysteresis inverter block can provide further hardening to the latch where area is not as critical of a concern.

It should also be noted that inverter blocks need not be used in pairs. A single inverter block can be used. For example, while latch 510A is coupled to hysteresis inverter blocks 520A and 520B, an alternative design can have a latch being coupled to only a single inverter block. In this alternative design, inverter sizes can be adjusted to compensate for an absence of one of the hysteresis inverter blocks.

While the description above has focused on a transmission gate based DFF, such an example is not intended to limit the scope of the present invention. In general, the principles of the present invention can be applied to other logic elements as would be apparent. For example, the principles of the present invention can be applied to a single latch.

Figure 6:
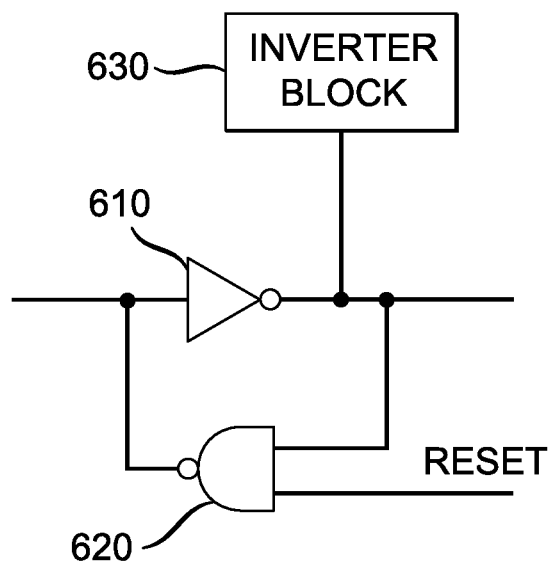
FIG. 6 illustrates an example of hardening.

As would be appreciated, other latch forms can also benefit from the principles of the present invention. For example, a hysteresis inverter block can be applied to a pulse flop such as that exemplified in FIG. 6. As illustrated, a pulse flop is formed by cross coupling inverter 610 and NAND gate 620. NAND gate 620 is also responsive to a reset signal. As illustrated, hysteresis inverter block 630 can be coupled to the pulse flop in a manner similar to that described above. As noted, one or more inverter blocks each having one or more pairs of inverters can be applied to the pulse flop to improve the SER.

As would be appreciated, hysteresis can be further applied to other styles of latches such as a differential latch, jamb latch, etc. In a further embodiment, the method of generating hysteresis can be based on schmitt trigger type inverters.

As has been described, the hysteresis-based hardening approach can help commercial designs stay competitive, yet reliable, in their environment of operation. With the increase in the susceptibility of circuits to radiation for terrestrial applications, there is a need for logic elements with improved SER performance at reduced performance penalties.

These and other aspects of the present invention will become apparent to those skilled in the art by a review of the preceding detailed description. Although a number of salient features of the present invention have been described above, the invention is capable of other embodiments and of being practiced and carried out in various ways that would be apparent to one of ordinary skill in the art after reading the disclosed invention, therefore the above description should not be considered to be exclusive of these other embodiments. Also, it is to be understood that the phraseology and terminology employed herein are for the purposes of description and should not be regarded as limiting.

What is claimed is:

1. A logic apparatus, comprising:
    a logic block having an input for receiving data and an output for producing data that has been stored in said logic block, said logic block including,
        a first inverter having an input and an output, said input being coupled to said input of said logic block, said output being coupled to said output of said logic block, and
        a digital logic component having an input and an output, said input of said digital logic component being coupled to said output of said first inverter, said output of said digital logic component being coupled to said input of said first inverter;
    a first inverter block, said first inverter block including one or more pairs of inverters, said one or more pairs of inverters being sequentially connected to form a loop, said loop of one or more pairs of inverters being coupled to one of said input and said output of said first inverter, wherein said first inverter block is coupled to said input of said first inverter; and
    a second inverter block that is coupled to said output of said first inverter, wherein said second inverter block includes one or more pairs of inverters, said one or more pairs of inverters being sequentially connected to form a loop.

2. The logic apparatus of claim 1, wherein said digital logic component is a second inverter.

3. The logic apparatus of claim 1, wherein said digital logic component is a NAND gate having a second input for receiving a reset signal.

4. The logic apparatus of claim 1, wherein said first inverter block includes one pair of inverters.

5. The logic apparatus of claim 4, wherein each of said inverters in said first inverter block is smaller than said first inverter.

6. The logic apparatus of claim 1, wherein said first inverter block includes two or more pairs of inverters.

7. The logic apparatus of claim 1, wherein said first inverter block includes a transmission gate in said loop, said transmission gate being responsive to an inverse of a clock signal that controls an application of data at said input of said logic block to said input of said first inverter.

8. The logic apparatus of claim 7, wherein said application of data at said input of said logic block is controlled by a second transmission gate that is responsive to said clock signal.

9. The logic apparatus of claim 1, wherein said first inverter block is coupled to said input of said first inverter.

10. The logic apparatus of claim 1, wherein said first inverter block is coupled to said output of said first inverter.

11. A logic apparatus, comprising:
    a first logic block having an input and an output, said input of said first logic block being configured to receive data via a first transmission gate, said first logic block including,
        a first inverter having an input and an output, said input of said first inverter being coupled to an input of said first logic block, said output of said first inverter being coupled to an output of said first logic block, and
        a second inverter having an input and an output, said input of said second inverter being coupled to said output of said first inverter, said output of said second inverter being coupled to said input of said first inverter;
    a second logic block having an input and an output, said input of said second logic block being coupled to said output of said first logic block via a second transmission gate, said second logic block including,
        a third inverter having an input and an output, said input of said third inverter being coupled to an input of said second logic block, said output of said third inverter being coupled to an output of said second logic block, and
        a fourth inverter having an input and an output, said input of said fourth inverter being coupled to said output of said third inverter, said output of said fourth inverter being coupled to said input of said third inverter;
    a first inverter block, said first inverter block including a first set of one or more pairs of inverters, said first set of one or more pairs of inverters being sequentially connected to form a first loop, said first loop of said first set of one or more pairs of inverters being coupled to an input of said first inverter;
    a second inverter block, said second inverter block including a second set of one or more pairs of inverters, said second set of one or more pairs of inverters being sequentially connected to form a second loop, said second loop of said second set of one or more pairs of inverters being coupled to an output of said first inverter;
    a third inverter block, said third invert block including a third set of one more pairs of inverters, said third set of one or more pairs of inverters being sequentially connected to form a third loop, said third loop of said third set of one or more pairs of inverters being coupled to an input of said third inverter; and a fourth inverter block, said fourth inverter block including a fourth set of one or more pairs of inverters, said fourth set of one or more pairs of inverters being sequentially connected to form a fourth loop, said fourth loop of said fourth set of one or more pairs of inverters being coupled to an output of said third inverter.

12. The logic apparatus of claim 11, wherein said first inverter block and said second inverter block have the same number of pairs of inverters.

13. The logic apparatus of claim 12, wherein said first inverter block has one pair of inverters.

14. The logic apparatus of claim 12, wherein said first inverter block has more than one pair of inverters.

15. A logic apparatus, comprising:
a logic block having a pair of inverters, an input of said logic block being configured to received data for storage in said logic block, an output of said logic block being configured to present data that is stored in said logic block; and
a first inverter block including one or more pairs of inverters, said one or more pairs of inverters being sequentially connected to form a loop, said loop of said one or more pairs of inverters having a single external coupling to an input of a first of said pair of inverters in said logic block; and
a second inverter block including one or more pairs of inverters, said one or more pairs of inverters in said second inverter block being sequentially connected to form a second loop, said second loop of said one or more pairs of inverters in said second inverter block having a single external coupling to an input of a second of said pair of inverters in said logic block.

16. The device of claim 15, wherein said first inverter block includes one pair of inverters.

17. The device of claim 15, wherein said first inverter block includes two or more pairs of inverters.

* * * * *